United States Patent [19]

Fang

[11] Patent Number: 4,599,707

[45] Date of Patent: Jul. 8, 1986

[54] BYTE WIDE EEPROM WITH INDIVIDUAL WRITE CIRCUITS AND WRITE PREVENTION MEANS

[75] Inventor: Sheng Fang, Sunnyvale, Calif.

[73] Assignee: Signetics Corporation, Sunnyvale, Calif.

[21] Appl. No.: 585,319

[22] Filed: Mar. 1, 1984

[51] Int. Cl.[4] .......................... G11C 7/00; G11C 11/40
[52] U.S. Cl. ..................................... 365/185; 365/189; 365/195
[58] Field of Search ............... 365/184, 185, 189, 195, 365/218, 182, 104

[56] References Cited

U.S. PATENT DOCUMENTS 4,090,258  5/1978  Cricchi ................................ 365/184
4,149,270  4/1979  Cricchi et al. ...................... 365/184
4,477,884 10/1984  Iwahashi et al. .................... 365/189

FOREIGN PATENT DOCUMENTS

0137933 10/1979  Japan .................................. 365/185

Primary Examiner—James W. Moffitt
Assistant Examiner—Glenn A. Gossage
Attorney, Agent, or Firm—Robert T. Mayer

[57] ABSTRACT

An array arrangement for EEPROMS in which each memory cell has two transistors. Selection is simplified whereby in selecting a cell all of the cells in the selected row are connected to one terminal of the writing circuit and all the cells in the selected column are connected to the other terminal. This selection process prevents any cell from being written into except the cell at the intersection of the selected row and the selected column.

5 Claims, 10 Drawing Figures

BYTE WIDE EEPROM WITH INDIVIDUAL WRITE CIRCUITS AND WRITE PREVENTION MEANS

The invention relates to large scale integrated circuit memories. In particular, it relates to an improved array arrangement for an EEPROM.

This application involves an improvement over the subject matter of U.S. patent application entitled "Array Arrangement for EEPROMS," application Ser. No. 512,853, filed July 11, 1983 and assigned to the same assignee as this application. That application and its companion application Ser. No. 512,858, entitled "One Step Write Circuit For EEPROMS," filed July 11, 1983 are incorporated by reference herein.

It is an object of this invention to provide an improved EEPROM array arrangement.

One of the features of the invention is the simplified addressing or selection system which permits a reduction in the complexity of the memory array.

An advantage of the invention is the decrease in the number of transistors needed in each memory cell of the array.

In accordance with the invention there is provided in a memory system of the EEPROM type a plurality of sections of columns and rows of memory cells forming a plurality of bytes of memory. Each section includes a writing circuit having two terminals for charging and discharging its associated cells by the application of differential voltages thereto. Each row in each section includes one memory cell for each column in the section. Each section includes the same number of rows and the same number of columns. Each of the memory cells in the same row and column location in each section together comprise each byte of memory. The improvement comprises simplified selection means which connects all of the memory cells in a selected row to one terminal of the associated writing circuit and all of the memory cells of a related column to the other terminal of the associated writing circuit. Each selection means includes prevention means preventing the associated writing circuit from applying a charging or discharging differential voltage to any memory cell except that in both the selected row and the selected column. Each writing circuit is capable of changing information in its associated cell from a first state to a second state or vice versa while another writing circuit is simultaneously making the same or a different change in the information in its associated selected cell.

Other objects, features and advantages of the invention will be apparent to those skilled in the art from the following description and appended claims when considered in conjunction with the accompanying drawing in which:

Figure 1:
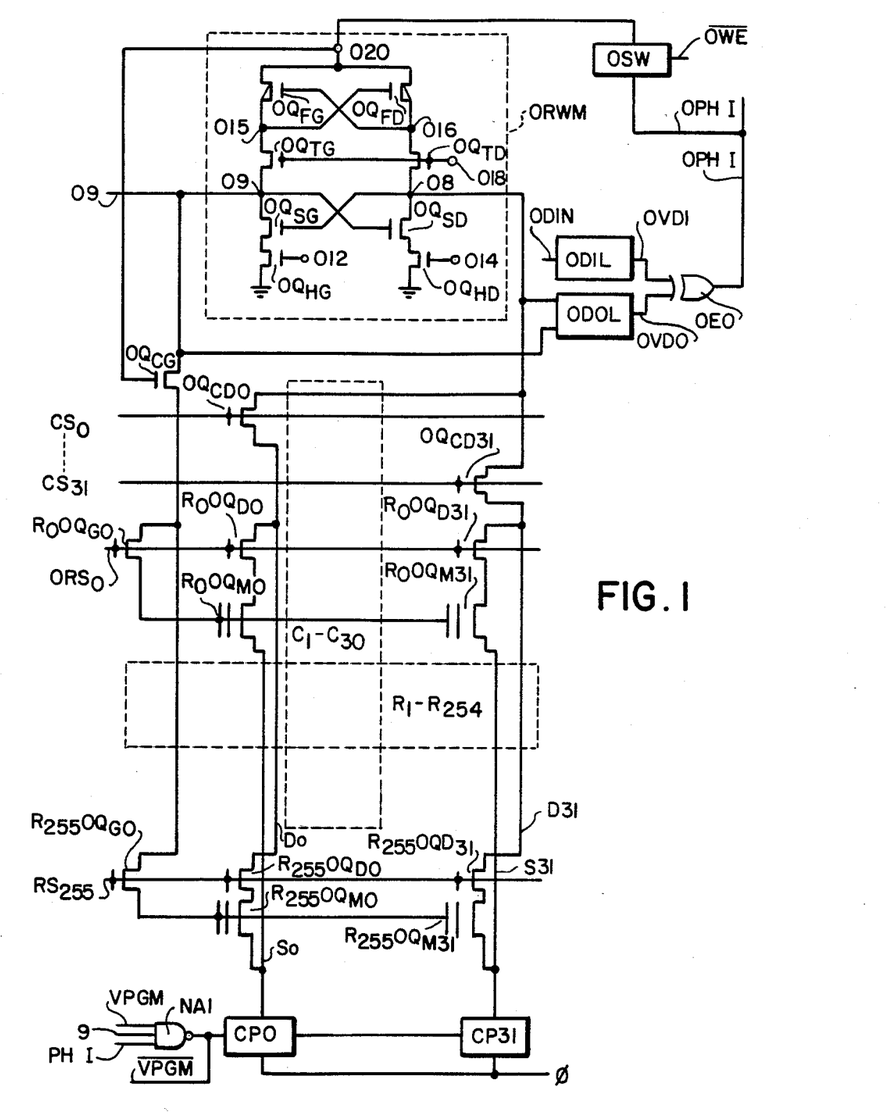
FIG. 1 is a simplified diagram of one of eight sections of an EEPROM array.

Referring to FIG. 1, there is shown therein a first of eight sections of an EEPROM array, each section containing 8192 memory cells arranged in 32 columns and 256 rows. Four floating gate field effect transistors $R_0 0 Q_{M0}$, $R_0 0 Q_{M31}$, $R_{255} 0 Q_{M0}$, and $R_{255} 0 Q_{M31}$ of the first section of the EEPROM array are illustrated. These transistors are the memory cell of the first row of the first column, the memory cell of the first row of the 32nd column and the memory cells of the 256th row, first column and 32nd column all of the first section. The memory cells of the second through 31st column of the first section are not shown for simplification purposes and are designated as the vertically disposed dotted line box marked C1–C30. Likewise the second through 255th rows of memory cells of the first section are also not shown for purposes of simplification and are designated as the horizontally disposed dotted line box identified as R1–R254.

Each of the memory cells of the array comprises a floating gate field effect transistor, such as, $R_0 0 Q_{M0}$ for the cell of the first row and column of the first section and its associated conventional field effect transistor $R_0 0 Q_{D0}$ Each of the memory cells of the first section is associated with a common row select conventional field effect transistor identified by the references $R_0 0 Q_{G0}$ and $R_{255} 0 Q_{G0}$ for the two illustrated rows.

All the memory cells in a column of the first section are associated with a column select field effect transistor, such as $0 Q_{CD0}$ and $0 Q_{CD31}$ for the first and 32nd columns.

It is to be understood that there are in the array for the second through eighth sections identical memory cells as just described for the first section. Sections two through eight are not shown for simplification purposes, each being identical to section one. Each section contains one memory cell of each eight cell byte of the array. Thus by selecting the same row and column in each section one can read out or write into all eight cells of the associated byte. Similar arrays are disclosed in the forementioned application Ser. Nos. 512,853 and 512,858.

For simplification purposes hereinafter each memory cell floating gate transistor will be designated as $Q_M$ (see FIG. 2) and its associated conventional field effect transistor whose source is connected to the drain of its associated memory cell transistor will be designated $Q_D$ for drain select transistor. This disregards row location and column location. In each memory cell group the common row select transistors $Q_G$ have their drains connected to the section select line and through section select transistor $Q_{CG}$ to terminal 9 of reading and writing circuit RWM. Each common row select transistor $Q_G$ has its source connected to the gates of the floating gate memory cell transistors $Q_M$ of that row. The drain select transistors $Q_D$ of each cell have their drains connected to associated column select lines and their sources connected to the drains of associated memory cell floating gate transistors $Q_M$. The source of each memory cell transistor $Q_M$ is connected to part of an associated prevention means CP0–CP31. The gates of both the row select transistor $Q_G$ and the drain select transistor $Q_D$ in each row in each column is connected to its associated row select line RS.

Figure 2:
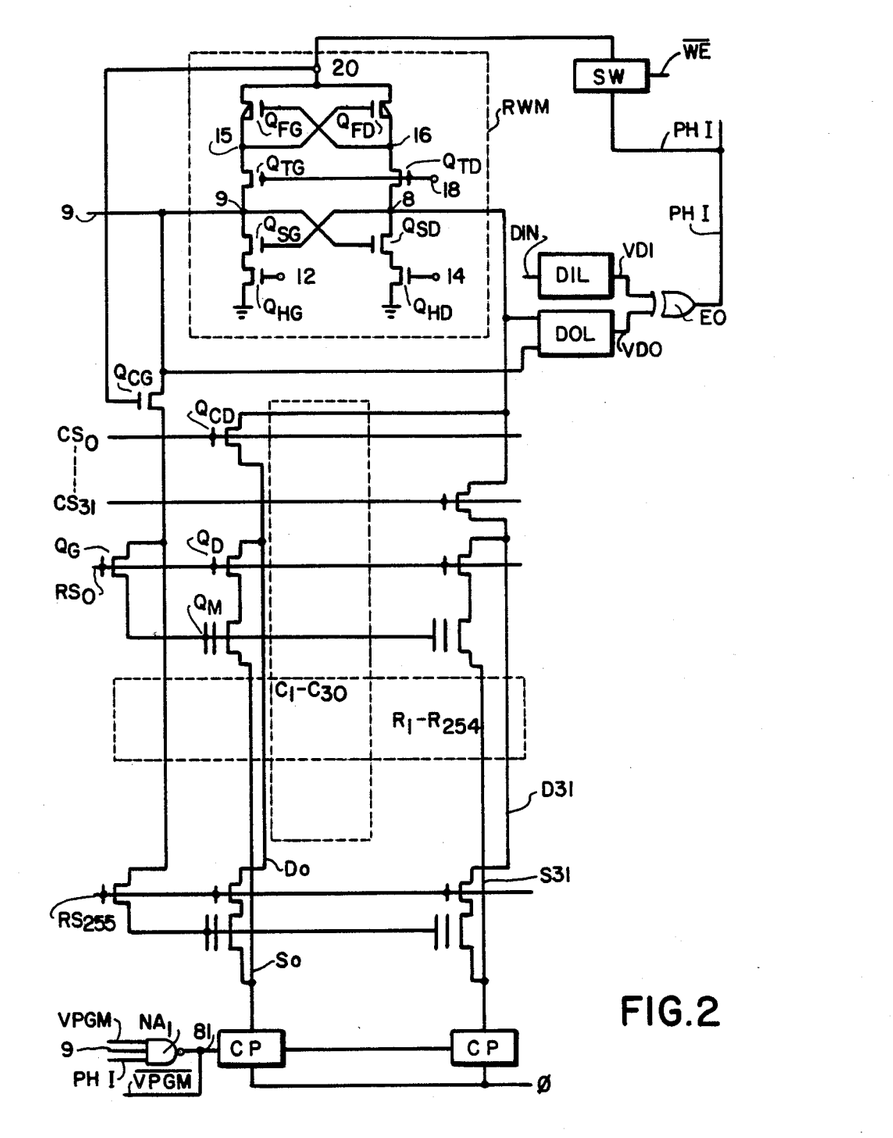
FIG. 2 is an exemplary diagram of one of the eight sections.

The drain of drain select transistor $Q_D$ is connected to line 8 of reading and writing circuit RWM through column select transistor $Q_{CD}$.

Reading and writing circuit RWM for each section comprises a gate column select circuit comprising transistors $Q_{FG}$, $Q_{TG}$, $Q_{SG}$ and $Q_{HG}$ and its complementary drain column select circuit including transistors $Q_{FD}$, $Q_{TD}$, $Q_{SD}$ and $Q_{HD}$.

All transistors shown in FIG. 2 are field effect N-channel devices except for transistors $Q_{FG}$ and $Q_{FD}$ which are P-channel devices. These latter two transistors are arranged in a flipflop circuit and together with transistors $Q_{TG}$ and $Q_{TD}$ provide connections from terminal 20 to lines 8 and 9. As will be described later the flipflop circuit is in a first state to charge an associated memory cell and in a second state to discharge it. Transistors $Q_{SG}$ and $Q_{SD}$ provide a second flipflop circuit and these together with transistors $Q_{HG}$ and $Q_{HD}$ provide connections from lines 9 and 8 to ground.

Also shown in FIG. 2 is a representative writing means for one section of the array including an input signal latch DIL and an output signal latch DOL. The inputs of output signal latch DOL are connected to lines 8 and 9 of reading and writing circuit RWM which is also part of the representative writing means. Output line VDO of the writing means is connected to one input of a comparison means comprising exclusive OR EO. The input of data input latch DIL is connected to data input line DIN and its output line VDI is connected to the second input of exclusive OR EO. The output of the exclusive OR is connected to an input of switch SW. Another input is connected to line $\overline{WE}$. The output from switch SW is connected to terminal 20 of reading and writing circuit RWM.

Nand gate NA1 has its inputs connected to terminal 9 of reading and writing circuit RWM, to output line PHI of exclusive OR E0 and to line VPGM. The output from gate NA1 is applied to the inputs of prevention means CP0 through CP31. Other inputs to the prevention means are applied along clock pulse line $\phi$ and line $\overline{VPGM}$.

Figure 3A:
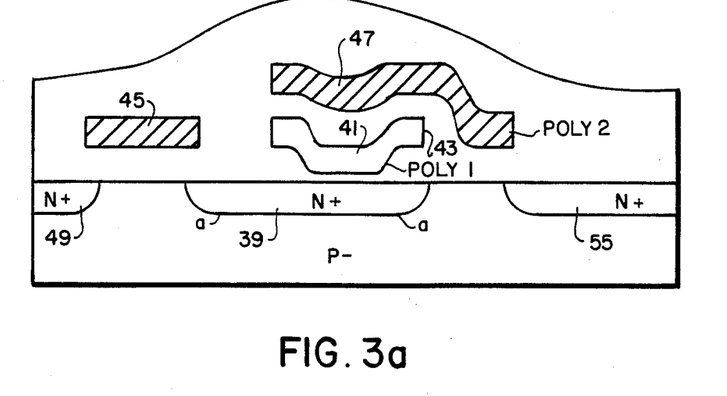
FIGS. 3a and 3b are cross-sectional drawings of the composite memory cell used in the array of the invention.
Figure 3B:
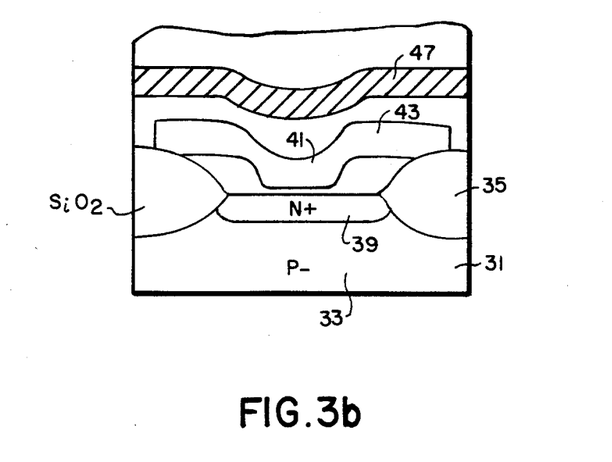

Each memory cell $Q_M$, $Q_D$ of FIG. 2 comprises a composite memory cell as shown in FIGS. 3a and 3b. Except as hereinafter indicated as unique, conventional masking, etching and cleansing techniques are employed to produce the various regions shown in FIGS. 3a and 3b in order to fabricate these cells.

The starting material for each cell is a P-type monocrystalline silicon substrate 31 (FIG. 3) having a resistivity of about 25 ohm-cm. Oxide-isolation region 35 (FIG. 3b) having a depth at that time of about 1.0 micron is then formed according to conventional techniques to define active region 33 and laterally electrically isolate it from other such active regions. Any standard method is employed to leave a surface area as wide as that marked a—a on FIG. 3a free of oxide.

Phosphorous is then selectively diffused at a desired dosage into region 33 (FIG. 3b) to create that part of N+ region 39, which will be located generally below the intended location for the tunnelling insulating layer. This part is generally defined in FIG. 3a by the portion of region 39 marked a—a. A 900-angstrom layer of silicon dioxide is grown along the upper surface of region 33. The portion of this oxide layer above the intended site of sunken portion 41 of floating gate 43 is etched away down to the underlying silicon. At the exposed silicon, a thin layer of silicon dioxide having a thickness of about 100 angstroms is grown. A first layer 43 of intrinsic polycrystalline silicon (polysilicon) having a thickness of about 2500 angstroms is deposited on top of the wafer. This layer (poly I) is approximately patterned as shown in FIGS. 3a and 3b.

Oxide is then grown differentially above layer 43 with about 1000 angstroms grown above part 41 of layer 43 over the thin oxide and about 500 angstroms grown above the rest of the layer. A second region of polysilicon (poly II) is then deposited and patterned to form gates 45 and 47. All oxide above the substrate is etched away as is whatever portion of poly I layer 43 which may extend beyond the left edge of poly II region 47 (as shown in FIG. 3a). Region 47 uniquely serves as a mask for so etching poly I region 43.

With gates 45 and 47 serving as masks additional phosphorous is diffused at a desired dosage to form regions 49 and 55 and to extend region 39 until it approximates that shown in FIG. 3a.

After diffusion oxide is again grown as desired to cover the exposed substrate and gates 43, 45 and 47.

Gates 42, 45 and 47 together with regions 39, 33 and 55 form a composite memory cell which can have gate 43 charged by applying 20 volts on gate 47 and zero volts on region 39. Discharging is accomplished by applying zero volts to gate 47 and 20 volts to region 39.

Figure 4:
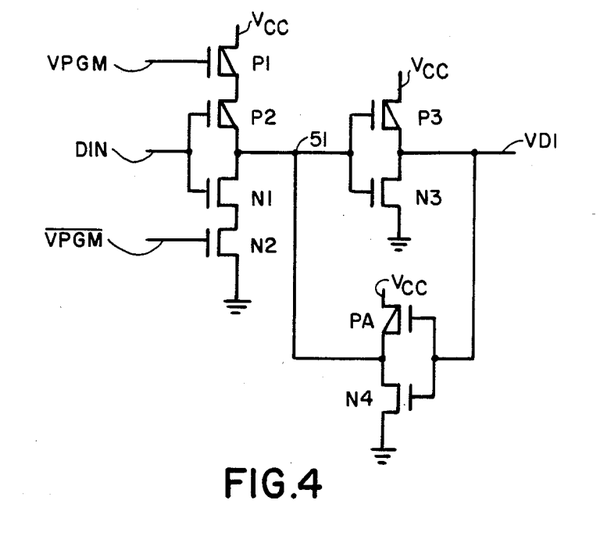
FIG. 4 is a detailed circuit diagram of one of the elements of FIG. 2.

Shown in FIG. 4 is the circuitry comprising data input latch DIL. It will simplify the explanation of the operation of this circuitry if it is understood that in accordance with the invention a writing operation is always preceded by a reading operation. This provides that feature which causes a writing operation to take place only if the data in a memory cell is to be changed. In addition, data input latch DIL only needs to be switched if the next input to a cell is different from the last input through the latch. Thus, if the last input switched the latch to place a binary 1 on line VDI, this caused N-channel gate N4 in FIG. 4 to turn on which maintains a binary 0 at terminal 51. This keeps P-channel gate P3 on and $V_{cc}$ potential (binary 1) stays on line VDI. Throughout the remainder of this description of FIGS. 4 through 8 N-channel gates are identified by the prefix letter N and P-channel gates by the prefix letter P.

If it is desired to change a cell from a binary 1 to a binary 0, the conditions recited above prevail when the reading cycle begins, except that a binary 0 appears on line DIN. This turns on P-channel gate P2 and maintains N-channel gate N1 off. During reading cycles the signal on line VPGM is low and this turns on P-channel gate P1. Thus $V_{cc}$ potential (binary 1) appears at terminal 51. This turns off gate P3 and turns on gate N3 placing ground potential (binary 0) on line VDI. Consequently, gate N4 turns off and gate P4 turns on to maintains terminal 51 at the binary 1 level.

To change a cell from the binary 0 level to the binary 1 level, the conditions recited at the end of the paragraph above prevail when the reading cycle preceeding the writing cycle begins. Then a binary 1 appears on line DIN. This turns gate N1 on and maintains gate P1 off. During reading cycles line $\overline{VPGM}$ is high and gate N2 also turns on. This puts ground potential (binary 0) at terminal 51. Consequently, gate N3 turns off and gate P3 turns on to apply $V_{cc}$ potential (binary 1) on line VDI. This turns off gate P4 and turns on gate N4 to keep ground potential (binary 0) at terminal 51.

Data output latch DOL (FIG. 5) provides a binary 1 signal along line VDO when line 8 is at binary 0 and line 9 is at binary 1. It provides a binary 0 signal along line VDO when line 8 is at binary 1 and line 9 is at binary 0. With a binary 0 on line 8 gate P5 (FIG. 5) is on and gate N5 is off. $V_{cc}$ potential (binary 1) is applied through gate P5 to line VDO and to gate N7 to turn it on. Gate N8 is on by virtue of the binary 1 on line 9. Therefore, ground potential (binary 0) is applied to gate P6 to turn it on. As a result, $V_{cc}$ potential (binary 1) is maintained on line VDO through gate P6.

Figure 5:
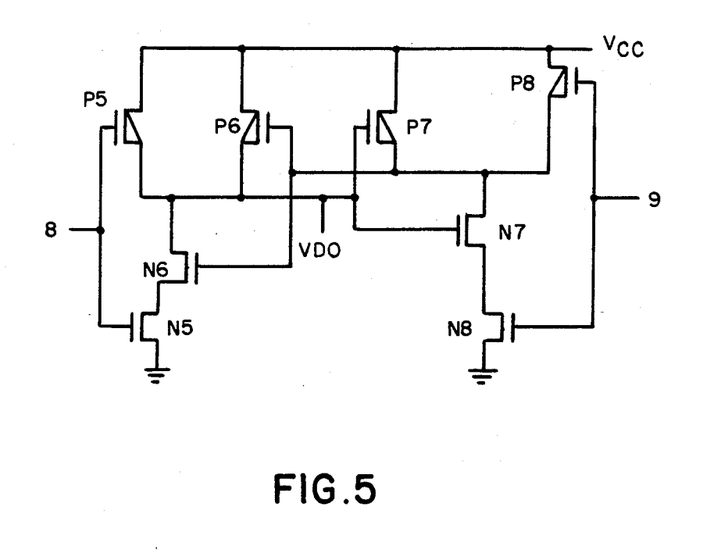
FIG. 5 is a detailed circuit diagram of another of the elements of FIG. 2.

In the alternative condition with line 8 high and line 9 low, gates N5, N6 and P8 are turned on to apply ground potential (binary 0) to line VDO.

Exclusive OR EO produces a binary 1 signal if either one but only one of its input lines VDI or VDO carry a binary 1. In all other conditions it provides a binary 0 for its output line PHI. Assuming a binary 1 applied along VDI and a binary 0 along VDO, gate P10 (FIG. 6) is turned on to apply a binary 0 to gate N13 to turn it on. At the same time gate N14 is on and ground or binary 0 is applied through it and gate N13 to gate P15 to turn it on which applies a binary 1 along line PHI. If binary 1 signals appear along both lines VDI and VDO gates N9 and N10 are both turned on applying binary 0's to gates P10 and P13 to turn them on also. One applies a binary 1 to gate N16 and the other to gate N15 turning both on to apply ground potential (binary 0) along line PHI.

Figure 6:
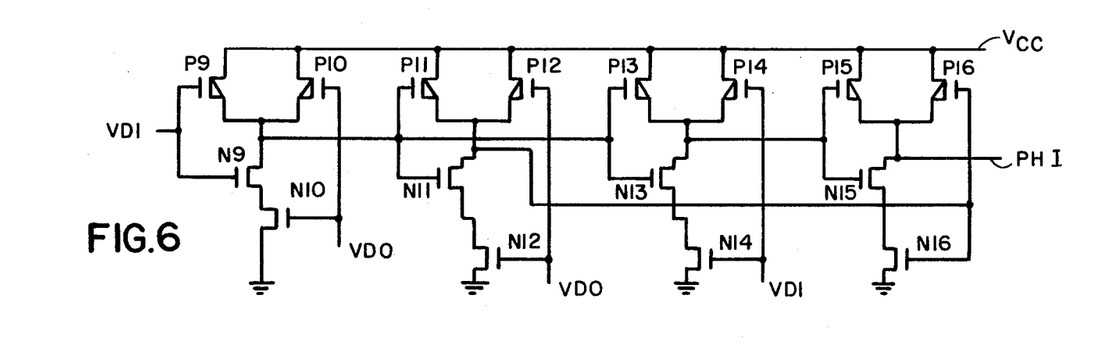
FIG. 6 is a detailed circuit diagram of still another of the elements of FIG. 2.

If binary 0's are applied along both line VDI and VDO, gates P12 and P14 are both turned on to apply binary 1 signals to gates N15 and N16. These both turn on again to apply a binary 0 along line PHI.

If a binary 0 is applied along line VDI and a binary 1 along line VDO, gate P9 is turned on to apply a binary 1 to gate N11 turning it on. Gate N12 is turned on by the binary 1 along line VDO. These then connect ground to gate P16 turning it on to apply $V_{cc}$ potential (binary 1) to line PHI.

Figure 7:
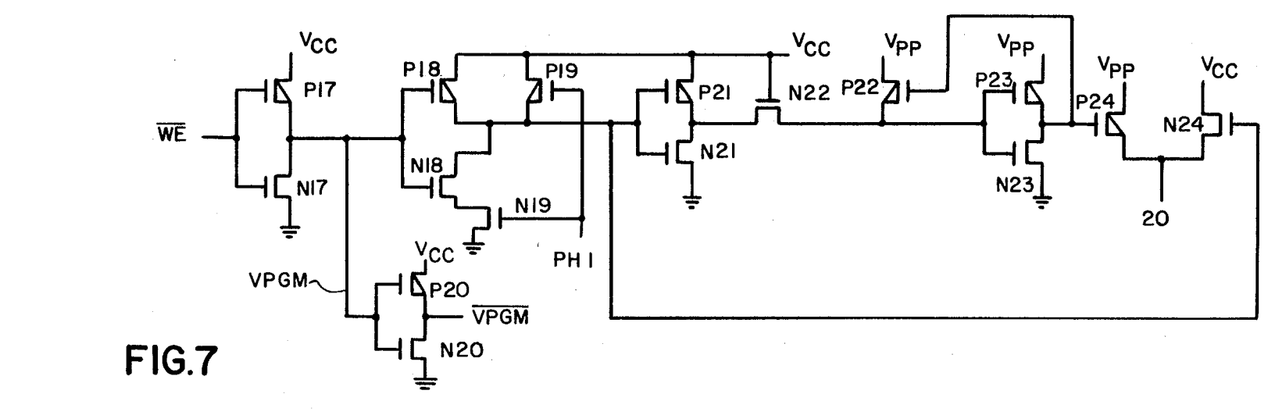
FIG. 7 is a detailed circuit diagram of yet another of the elements of FIG. 2.

Shown in FIG. 7 is the detailed circuitry of switch SW for transferring the voltage applied to terminal 20 of reading and writing circuit RWM from the reading potential $V_{cc}$ to the writing potential $V_{pp}$. A signal applied along line $\overline{WE}$ is inverted by the inverter formed by gates P17 and N17. A binary 1 signal along line $\overline{WE}$ indicates a reading operation and causes a binary 0 to be applied along line VPGM. The inverter formed by gates P20 and N20 inverts this to apply a binary 1 along line $\overline{VPGM}$. Under these conditions gate P18 is turned on and a binary 1 is applied to gates N21 and N24 turning them on. Gate N21 applies ground to gate P23 turning gate P23 on and gates P22 and P24 off. Gate N24 applies $V_{cc}$ potential (reading voltage) to terminal 20 of reading and writing circuit RWM.

When a writing operation is desired line VPGM goes high and line $\overline{VPGM}$ goes low but without effect if line PHI remains at a binary 0 indicating a change in information is not needed in its associated memory cell.

Assuming a change in information is desired when VPGM goes high gate N18 is turned on. When PHI goes high gate N19 is turned on and ground potential is applied to both N21 and N24 turning both off. This removes $V_{cc}$ potential from terminal 20 of reading and writing circuit RWM. The ground applied through gates N18 and N19 turns gate P21 on which, in turn, turns gate P23 off and gate N23 on. This applies ground potential to gate P24 turning it on and applying the writing potential $V_{pp}$ to terminal 20 of the reading and writing circuit RWM.

Figure 8:
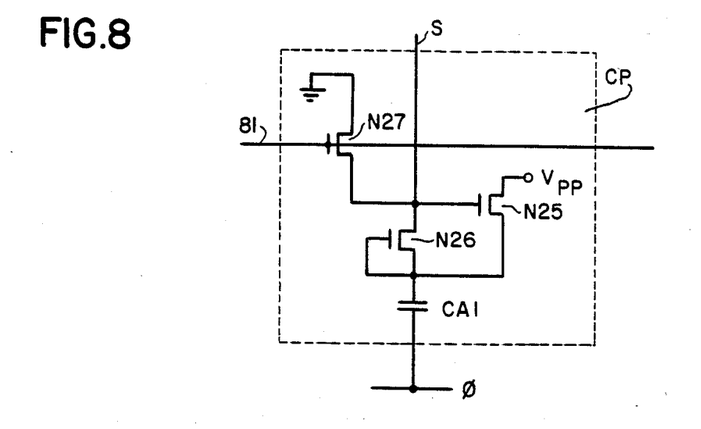
FIG. 8 is a detailed circuit diagram of yet another of the elements of FIG. 2.

Prevention means CP of FIG. 2 is shown in detail in FIG. 8. When line 81 has a binary 1 applied to it it turns on transistor N27 and causes ground potential to be applied along line S. With a binary 0 applied along line 81 the charge pump which comprises part of the prevention means applies $V_{pp}$ potential to line S each time the clock pulse appears along line $\phi$. The clock pulse is applied across capacitor CA1 to cause transistor N26 to turn on. This causes N25 to turn on as well and apply $V_{pp}$ through N25 and N26 to line S.

Figure 9:
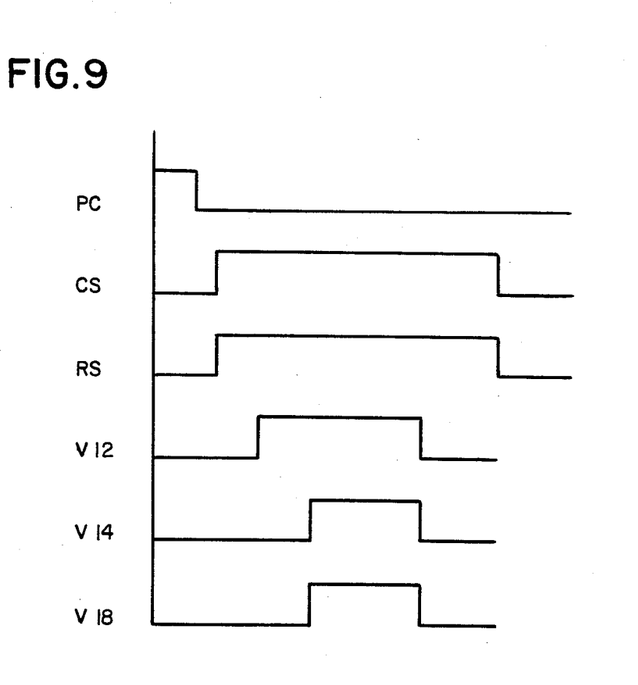
FIG. 9 is a timing circuit of some of the pulses used in performing the reading and writing cycles of the described memory.

The operation of one memory cell will now be described with reference to FIG. 2. To read a particular cell as is well known, a select voltage is applied to the column select line associated with that cell as well as to the row select line associated with that cell thereby addressing or selecting the cell. It is to be understood that the same row select line and column select line is simultaneously selected in each of the eight sections thereby addressing the whole byte. That is the only row select line and column select line so selected in each section and thus only one cell is selected in each section. Assume row zero and column zero to have been so selected, the select voltages (source not shown) cause transistors $Q_G$ and $Q_D$ together with transistor $Q_{CD}$ to turn on. Also assume the floating gate of transistor $Q_M$ to be discharged, then this memory cell is in a first state which will be designated as having a binary 1 stored in it. Since a reading operation is assumed line $\overline{VPGM}$ is high applying a binary 1 to input 81 of prevention means CP. This applies ground potential along line $S_0$. At this time a reading voltage $V_{cc}$ is applied to terminal 20 from switch SW, as previously explained in connection with FIG. 7. Line 8 is at the ground potential of the source of transistor $Q_M$ when it ($Q_M$) is turned on by the voltage applied through transistors $Q_{CG}$ and $Q_G$ from line 9 by the precharging of that line. (The precharging operation is not described as it is a well known operation to those skilled in the art.) When voltage $V_{12}$ is applied in any known manner to terminal 12 transistor $Q_{HG}$ is turned on but line 9 remains high because transistor $Q_{SG}$ remains off because of the low voltage applied to its gate from line 8. Thereafter when voltage $V_{14}$ (FIG. 9) is applied in any well known manner to terminal 14 transistor $Q_{HD}$ turns on and it and transistor $Q_{SD}$ (which has been turned on by the voltage at line 9) provide another path to ground for line 8. Subsequently, voltage $V_{18}$ (FIG. 9) is applied to terminal 18 in any well known manner to turn on both transistors $Q_{TG}$ and $Q_{TD}$. As a consequence terminal 15 goes high to the voltage of line 9 and terminal 16 goes low to the ground potential of line 8. This turns transistor $Q_{FG}$ on and applies voltage $V_{cc}$ to line 9 to maintain it at a high potential. A voltage differential with line 8 at a lower potential than line 9 indicates the storing of a binary 1 in transistor $Q_M$. This is signified by a binary 1 output from data output latch DOL along line VDO, as explained in connection with FIG. 5. This output along line VDO is applied to the lower input of exclusive OR EO without effect.

If the floating gate of memory cell $Q_M$ had been charged at the time the reading operation had started to indicate it in its second state, i.e. the storing of a binary 0 the cell would not conduct when the row select voltage was applied to line $RS_0$ and the precharge was applied along line 9. As a result line 8 would remain high due to the precharging voltage. Therefore, transistor $Q_{SG}$ would be turned on. Consequently when voltage $V_{12}$ is applied to transistor $Q_{HG}$ to turn it on, a path to ground through transistors $Q_{SG}$ and $Q_{HG}$ is provided for line 9. Thus transistor $Q_{SD}$ is turned off by the ground potential along line 9 and when voltage $V_{14}$ is applied to transistor $Q_{HD}$ its turning on would be without effect. When voltage $V_{18}$ is applied to terminal 18 to turn on transistors $Q_{TG}$ and $Q_{TD}$, under these circumstances, terminal 15 would go to ground potential while terminal 16 remained high. The ground potential at terminal 15 would turn transistor $Q_{FD}$ on this time and the potential $V_{cc}$ applied to terminal 20 in this case applied to line 8. A voltage differential with line 9 at a lower potential than line 8 indicates the storing of a binary 0 in the memory cell and, as explained causes data output latch DOL to produce a binary 0 from its output to be applied along line VDO to the lower input of exclusive OR EO. The operation of exclusive OR EO is without effect during a reading operation and can be ignored.

If a writing cycle is to take place the reading cycle as just explained is conducted preliminary to the writing operation. During a writing cycle a binary 0 or a binary 1 is applied along line DIN to data input latch DIL. As explained in connection with FIG. 4, either of these signals causes data input latch DIL to produce the corresponding signal at its output and apply it along line VDI to the upper input of exclusive OR EO. Since a writing operation is necessary only if the data in the memory cell is to be changed exclusive OR EO is used to determine this requirement. As explained in connection with FIG. 6, if the data stored in a memory cell is the same as that applied along line DIN either two zeros or two ones are applied along lines VDI and VDO to the inputs of exclusive OR EO. In either case a binary 0 is applied from the output of exclusive OR EO along line PHI to switch SW. This prevents a writing cycle from commencing since it is not needed in view of the fact that the information in the associated cell is not going to be changed.

Assuming a binary 1 is stored in transistor $Q_M$ and that a binary 0 is to be stored therein. Line 8 is low with respect to line 9 during the $V_{18}$ pulse and as a consequence a binary 0 signal is applied along line VDI to the upper input of exclusive OR EO and a binary 1 is applied along line VDO to its lower input. This causes an output signal to be applied along line PHI to switch SW causing it (as previously explained in connection with FIG. 7) to transfer the voltage on terminal 20 from the reading voltage $V_{cc}$ to the higher writing voltage $V_{pp}$ when the writing cycle is initiated by the signal along line $\overline{WE}$ going low. Line VPGM goes high (as is line 9 and line PHI) causing a binary zero to be applied along line 81 by Nand gate NA1. As a result the writing voltate $V_{pp}$ is applied along lines S by each prevention means CP. This prevents any cell to which this voltage is applied from being written into notwithstanding its gate might go high. The source and drain of memory transistor $Q_M$ of the selected cell remains at the ground potential of line 8 applied through transistors $Q_{CD}$ and $Q_D$.

The writing voltage $V_{pp}$ is also applied through transistor $Q_{FG}$ and transistor $Q_{TG}$ to line 9 and through transistors $Q_{CG}$ and $Q_G$ to the gate of memory cell transistor $Q_M$. With its gate at the writing voltage potential and its source and drain both at ground potential the floating gate of transistor $Q_M$ is charged to change the information stored therein to a binary 0.

Consider the cells in the selected row but in the thirty-one (31) unselected columns. The insulated gates of their memory transistors $Q_M$ are near $V_{pp}$ and their drains are floating since their column select transistors $Q_{CD}$ are off. As mentioned above their sources are near $V_{pp}$ as a result of the charging from their charge pumps or prevention means CP. The charge pumps CP serve their prevention purpose in this way.

Consider the cells in the selected column but in the two hundred and fifty five (255) unselected rows. The insulated gates of these cells are floating since their row select transistors $Q_G$ are off. Their sources are at the ground potential of line 8. Their drains are floating because their select transistors $Q_D$ are off since their gates are floating. The formation of each memory cell as a composite with a memory portion and a select portion produces decoding to prevent non-selected cells in selected columns from being written into.

Assuming a binary 0 is stored in transistor $Q_M$ and that a binary 1 is to be written therein, line 8 is high with respect to line 9 when the pulse $V_{18}$ is applied to terminal 18. As a consequence data output latch DOL applies a binary 0 to the lower input of exclusive OR EO along line VDO while the data input latch DIL applies a binary 1 to its upper input along line VDI. Line 9 being low Nand gate NA1 applies a binary 1 to prevention means CP grounding the source lines of all memory transistors $Q_M$. Again switch SW applies the writing voltage $V_{pp}$ to terminal 20 in place of the reading voltage $V_{cc}$. This time, however, transistor $Q_{FG}$ is turned off and transistor $Q_{FD}$ is turned on as previously explained during the reading cycle operation. The writing voltage is thereby applied through transistor $Q_{FD}$ and transistor $Q_{TD}$ to line 8 and through transistors $Q_{CD}$ and $Q_D$ to the drain of memory cell transistor $Q_M$. With the writing voltage on its drain and the ground potential of line 9 applied through transistors $Q_{CG}$ and $Q_G$ on its gate the floating gate of memory cell transistor $Q_M$ is discharged. It thereafter stores a binary 1.

It is to be understood that when column "0" and row "0" are selected the memory cell $R_00Q_{M0}$ of the first section of the array (FIG. 1) and the corresponding memory cells of the other seven sections of the array are simultaneously selected. Since each memory cell has its own writing means it can be seen that line 09 can be high or low with respect to line 08 of FIG. 1 independent of the relationship between line 9 and line 8 of any other section. Because of this separation of each of the bits of every byte into separate sections it can be seen that the writing means of each section is operable during a writing cycle to write information in either state into a selected cell of a byte or not independently of the other selected cells of that byte.

With this arrangement it can be further seen that exclusive OR EO of the writing means of each section of the array enables the writing voltage to be applied only to the reading and writing circuit RWM associated with a cell where information is to be changed. This prevents such cells from being written into when not necessary.

Moreover, the separation of each of the bits of every byte into separate sections enables the writing circuits to write information in a first state into one selected cell containing information in a second state while simultaneously writing information in the second state into another selected cell containing information in said first state. Thus, assume the memory cell in a first bit position of column zero, row zero, namely $R_00Q_{M0}$ (FIG. 1)

has a binary 1 stored therein while the memory cell in the eighth bit position of column zero, row zero, has a 0 stored therein. With the present invention the former can be changed to a binary 0 during a writing cycle and the latter to a binary 1 simultaneously during the same writing cycle.

It is also to be understood that the arrangement disclosed herein employs only a two transistor cell as its memory cells. Moreover, all of the cells of a row are simultaneously connected to one terminal of the associated writing means when that row is selected. Notwithstanding, only that cell of the row can be written into which is in the selected column. This is provided for by the prevention means which prevents the writing means from applying and charging or discharging differential voltage to any other cell.

From the foregoing it is to be understood that various modifications to the above described arrangement of the invention will be evident to those skilled in the art. The arrangement described herein is for illustrative purposes and is not to be considered restrictive.

What is claimed is:

1. In a memory system of the EEPROM type including a plurality of sections of rows and columns of memory cells forming a plurality of bytes of memory, each section including a writing circuit having two terminals for charging and discharging its associated cells by applying differential voltages thereto, each row in each section including one memory cell for each column in the section, each section including the same number of rows and the same number of columns, each of the memory cells in the same row and column location in each section together comprising each byte of memory, the improvement comprising simplified selection means for each section connecting all of the memory cells in a selected row to one terminal (9) of an associated writing circuit and all of the memory cells of a selected column to the other terminal (8) of the associated writing circuit, each selection means including prevention means preventing the associated writing circuit from applying a charging or discharging differential voltage to any memory cell except that in both the selected row and the selected column, each said writing circuit being capable of changing information in an associated selected cell from a first state (discharged) to a second state (charged) or vice versa while another writing circuit is making the same or a different change in the information stored in its associated selected cell.

2. In a memory system of the EEPROM type according to claim 1, wherein each cell includes a floating gate field effect transistor ($Q_M$) and a conventional field effect transistor ($Q_D$), each transistor including a source, a gate and a drain, the source of said conventional transistor being connected to the drain of said floating gate field effect transistor, said selection means turning on said conventional transistor to connect the drain of said floating gate field effect transistor to said other terminal of its associated writing circuit.

3. In a memory system of the EEPROM type according to claim 2, wherein said selection means includes a separate row select transistor ($Q_G$) for each row connecting the gates of all of said floating gate field effect transistors ($Q_M$) in its associated row to said one terminal (9) and a separate column select transistor ($Q_{CD}$) for each column connecting the drains of all of said conventional transistors ($Q_D$) in its associated column to said other terminal (8), said column select transistors comprising part of said prevention means.

4. In a memory system of the EEPROM type according to claim 3, wherein each said prevention means operates when its associated writing circuit is to change information in a selected cell from said first state (discharged) to said second state (charged) to apply ground potential from said other terminal of said writing circuit to the drain of the column select transistor associated with said selected cell and to apply a higher potential to the sources of the floating gate transistor of each of the other memory cells in the selected row to prevent any other memory cell in said row from being charged, said writing circuit applying charging potential to the gate of the floating gate transistor of the selected cell from said one terminal through the associated row select transistor.

5. In a memory system of the EEPROM type according to claim 4, wherein each said prevention means operates when its associated writing circuit is to change information in a selected cell from said second state to said first state to apply discharging potential from said other terminal of said writing circuit to the drain of the column select transistor associated with said selected cell and to apply ground potential to the sources of the floating gate transistor of each of the memory cells in the selected row, said writing circuit applying ground potential to the gate of the floating gate transistor of the selected cell from said one terminal through the associated row select transistor.

* * * * *